United States Patent [19]

Leussler et al.

[11] Patent Number: 4,987,370
[45] Date of Patent: Jan. 22, 1991

[54] RF QUADRATURE COIL SYSTEM FOR AN MRI APPARATUS

[75] Inventors: Christoph G. Leussler; Andreas H. W. Wilchern, both of Hamburg, Fed. Rep. of Germany

[73] Assignee: U.S. Philips Corporation, New York, N.Y.

[21] Appl. No.: 366,101

[22] Filed: Jun. 13, 1989

[30] Foreign Application Priority Data

Jun. 14, 1988 [DE] Fed. Rep. of Germany ....... 3820169

[51] Int. Cl.$^5$ .............................................. G01R 33/20
[52] U.S. Cl. ...................................... 324/318; 324/322
[58] Field of Search ............... 324/300, 307, 309, 310, 324/311, 318, 322

[56] References Cited

U.S. PATENT DOCUMENTS

| | | | |
|---|---|---|---|
| 2,964,696 | 12/1960 | Pinkley | 324/322 |
| 4,467,282 | 8/1984 | Siebold | 324/309 |
| 4,665,368 | 5/1987 | Sugiyama | 324/318 |
| 4,695,801 | 9/1987 | Arakawa | 324/318 |
| 4,748,413 | 5/1988 | Frese | 324/318 |
| 4,767,993 | 8/1988 | Hanawa | 324/322 |

FOREIGN PATENT DOCUMENTS 0142760 11/1984 European Pat. Off. .

*Primary Examiner*—Michael J. Tokar
*Attorney, Agent, or Firm*—William Squire

[57] ABSTRACT

An rf quadrature coil system comprises two coil pairs, each of which consists of two coils; only one of the two coils of each pair is connected to an rf transmitter or rf receiver. High-quality factors and a high homogeneity of the rf field are thus obtained.

8 Claims, 1 Drawing Sheet

RF QUADRATURE COIL SYSTEM FOR AN MRI APPARATUS

The invention relates to an rf quadrature coil system for an MRI apparatus, comprising two coil pairs which are offset 90° with respect to one another and which can be connected to an rf receiver or an rf transmitter, each coil pair consisting of two similar coils which are arranged so as to be offset 180° with respect to one another on the circumference of a cylinder and which comprise conductor sections which extend parallel and perpendicularly to the coil axis.

Of interest is commonly owned co-pending application entitled MR Examination Apparatus Comprising a Circuit Decoupling the Two Systems of a Quadrature Coil Arrangement," Ser. No. 366,104 filed concurrently herewith by the present inventors.

Such an rf quadrature coil system is known from EP-PS No. 71 896. Coil systems of this kind can be used as a receiver coil and/or as a transmitter coil. When it is used as a receiver coil, the signal-to-noise ratio can be improved by as much as 3 dB with respect to a conventional coil system, and when it is used as a transmitter coil circularly polarized rf fields can be generated when electrical voltages which have been shifted 90° with respect to one another are applied to the two coil pairs; the required transmission power is thus halved!

In the known system each coil pair is tuned to resonance and connected to the rf transmitter or the rf receiver wherein each coil of the coil pair is connected to the transmitter or the receiver. As a result, standing waves may arise on the supply leads, resulting in a reduced performance.

It is the object of the present invention to perfect an rf quadrature coil system in this respect. This object is achieved in accordance with the invention in that the two coils of each pair are tuned to the same resonant frequency, only one of the coils of each coil pair being connectable to the rf receiver or the rf transmitter.

Thus, in accordance with the invention each time only one of the coils of a coil pair is connected to the rf receiver or transmitter. Use is made of the fact that the two coils of a coil pair are inductively coupled to one another. Because each of these two inductively coupled coils is tuned to the same natural resonance, a resonator pair having two modes of oscillation is formed. In the first mode of oscillation, the currents flow through the two coils in the same direction and in the second mode of oscillation an rf current flows in opposite directions through the two coils of a pair. In the first mode of oscillation a uniform rf field is produced inside the coil pair, so that this mode of oscillation of the resonator pair is utilized. The resonance frequency of this first mode of oscillation is below the natural resonance frequency of the two resonators, the resonance frequency of the second mode of oscillation being higher than the natural resonance frequency. Therefore, in order to utilize the first mode of oscillation the two resonators must be individually tuned to a natural resonance frequency which is so much higher than the operating frequency (i.e. the frequency of the rf pulses generated by the coil system or the spin resonance signals received thereby) that the operating frequency equals the resonance frequency of the first mode of oscillation.

Because each time only one of the two coils of a coil pair is connected to the rf transmitter or the rf receiver, the required supply leads may be so short and so arranged that standing waves are avoided and hence also a reduction of the performance.

In the known coil system the two coil pairs are arranged inside and outside an insulating supporting cylinder, respectively. Therefore, the two coil pairs are situated at a different distance from an object to be examined which is arranged inside the cylinder, so that they are loaded to a different extent and have a different performance. This disturbs the symmetry.

Improved symmetry is achieved when the conductor sections of both coil pairs which extend parallel to the cylinder axis are situated at the same distance from the common cylinder axis. The conductor sections of the coil pairs which extend parallel to the cylinder axis are then preferably supported by at least two annular supports which extend perpendicularly to the cylinder axis and which are concentric therewith, which supports are provided with recesses for said conductor sections which recesses are each time situated at the same distance from the cylinder axis.

In a further embodiment, the arc-shaped sections of one coil pair which are situated perpendicularly to the cylinder axis are arranged inside and those of the other coil pair are arranged outside the cylinder envelope defined by the conductor sections extending parallel to the cylinder axis. The arc-shaped conductor sections of one coil pair then have a radius which is slightly larger than that of the other coil pair, but the non-symmetry between the coil pairs is less than in the known system.

The invention will be described in detail hereinafter with reference to the drawing. Therein:

Figure 1:
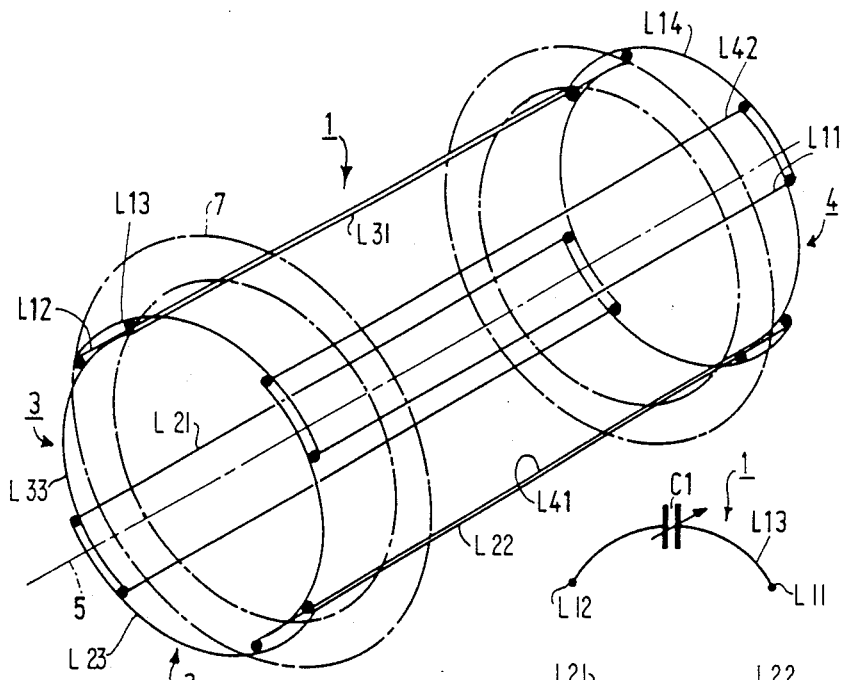
FIG. 1 is a perspective view of a coil system in accordance with the invention.
Figure 2:
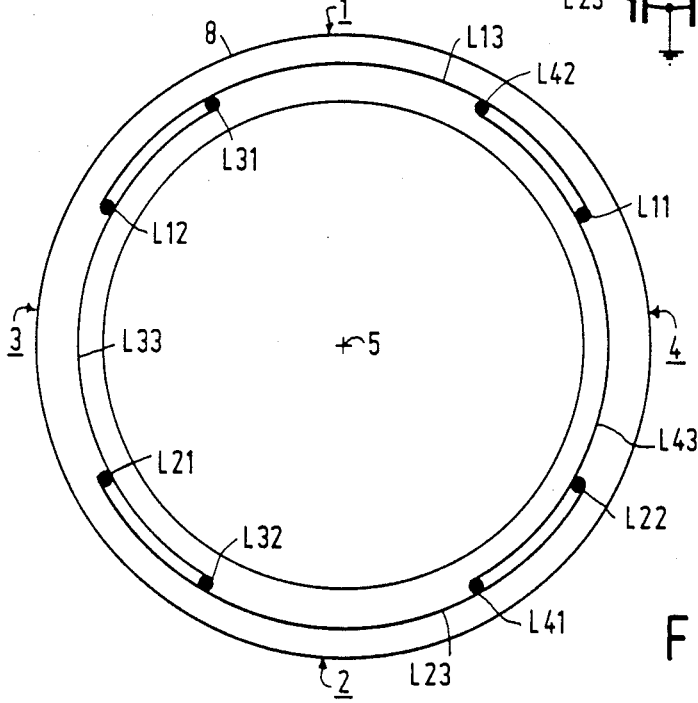
FIG. 2 is a cross-sectional view of such a system, taken perpendicularly to the cylinder axis.

As appears the from FIGS. 1 and 2, the quadrature coil system has a rotationally symmetrical construction. This coil system is arranged inside an MRI apparatus (not shown) so that its symmetry axis 5 extends in the direction of the uniform steady magnetic field generated in such MRI apparatus.

The coil system consists of two coil pairs 1, 2 and 3, 4 which are offset 90° with respect to the symmetry axis 5. Each coil pair consists of two coils 1, 2 and 3, 4, respectively, which are arranged so as to be 180° offset. Each of these four coils comprises two straight conductor sections L11 ... L41, L12 ... L42 extending parallel to the symmetry axis. These conductor sections L11 .. . L41, L12 ... L42 are situated at the same distance from the symmetry axis 5, thus defining a cylinder envelope for which the axis 5 is the cylinder axis. The straight conductor sections are supported by at least two annular supporting members 7, 8 whose centers are situated on the axis 5 and which are arranged perpendicularly with respect to this axis. The supporting members are made of an insulating material (plastics).

The ends of the two conductor sections of a coil are interconnected by way of arc-shaped conductor sections; for example, the ends of the conductor sections L11 and L12, belonging to the coil 1, are interconnected by way of the arc-shaped conductor sections L13 and L14. These conductor sections, being situated in planes perpendicular to the axis 5, describe an arc of 120° about the axis 5 in all coils. The four arc-shaped conductor sections (L13 ... L43), each time situated on one side of the coil system, therefore cannot be situated in the same plane as well as at the same distance from the axis 5. Therefore, these conductor sections are arranged in the same plane, but the conductor sections L33 and L43 of one coil pair 3, 4 are arranged inside and the arc-shaped conductor sections L13, L23 are arranged outside the cylinder envelope defined by the straight conductor sections L11 . . . L42. In order to prevent electrical contact between, for example the arc-shaped conductor section L13 associated with the coil 1 and the straight conductor sections L31 and L42 associated with the coils 3 and 4, insulating discs (not shown) are inserted between the non-associated conductor sections (for example L13 and L31 or L13 and L42).

Figure 3:
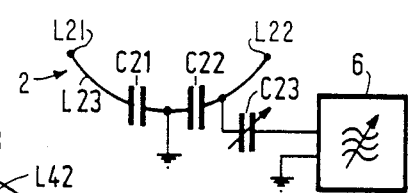
FIG. 3 shows the electrical connection of such a coil system.

FIG. 3 shows the electrical connection of a coil pair 1, 2. In the center of the two arc-shaped conductor sections L13 and L14 only the section L13 is shown in FIG. 3) the coil 1 comprises each time a tuning capacitor C1. The coil 2, forming a coil pair in conjunction with the coil 1, comprises tuning capacitors of the same value in the center of the corresponding conductor sections. One of these conductor sections, i.e. the section L23 in the example shown in FIG. 3, however, is connected to an rf transmitter (or an rf receiver) 6, the capacitance in the center of the conductor section being formed by a plurality of capacitors. Therefore, in the center of one arc-shaped conductor section (in this case L23) two capacitors C21 and C22 are connected in series, their junction point being grounded. The connection of the capacitor C22 which is remote from this point is connected, via a tuning capacitor C23, to an rf generator or an rf receiver 6. Via the low internal resistance (50 Ohm) of the transmitter or receiver 6, the capacitor C23 is connected substantially parallel to the capacitor C22. Consequently, the sum of the capacitances C22 and C23 is approximately equal to the capacitance C21. For reasons of symmetry the capacitance of the capacitor C21 amounts to approximately twice that of the capacitor C1.

As appears from FIG. 3, only one of the two coils of a coil pair is connected to the rf transmitter or receiver. The other rf coil, however, is inductively coupled thereto. In conjunction with the capacitors it contains, each coil forms a resonator. The coupled resonator pair thus formed can oscillate in two different modes. In the first mode of oscillation, rf currents flow through the resonators in the same direction. In the second mode of oscillation, the rf currents flow through the rf coils in opposite directions. Inside the resonator pair the second mode of oscillation produces a very disuniform rf magnetic field, while the first mode of oscillation produces a substantially uniform rf field. Because MRI examinations require homogeneity of the rf field generated, only the first mode of oscillation will be of interest. The resonance frequency associated with the first mode of oscillation is lower (and the resonance frequency associated with the second mode of oscillation is higher) than the natural resonance frequency of a resonator system, i.e. the frequency occurring in the absence of coupling to the second resonator. Consequently, the two resonators must be tuned to a (natural resonance) frequency which exceeds the operating frequency required for spin resonance, in order to ensure that the resonance frequency in the first mode of oscillation equals the operating frequency.

For example, when the quadrature coil system is to be used in an MRI apparatus designed for an induction flux density of 0.5 T, the operating frequency amounts to approximately 21.3 MHz. The resonance frequency for the first oscillation mode is then equal to this operating frequency when the individual resonators are tuned to a natural resonance frequency of approximately 21.8 MHz; the frequency of the undesirable second mode of oscillation would then be approximately 22.3 MHz.

Tuning and symmetry can be achieved as follows:

First the resonator which is connected to the rf transmitter or receiver 6 is separately tuned to a frequency of approximately 21.8 MHz. The coil 1 either should not occupy the position shown in the FIGS. 1 and 2 or its circuit must be interrupted in order to ensure that the resultant resonance frequency corresponds to the natural frequency of the coil 2. When the coil 2 has been correctly tuned to the stated frequency of approximately 21.8 MHz, a current maximum or a current anti node occurs in the center of its straight conductors L21, L22 when this frequency is applied to this coil. In the same position a voltage node occurs, so that it acts as a virtual ground point. When this position is grounded, therefore, the electrical behaviour will not be modified; this may be come apparent, for example as a non-changed reading of the input reflection factor of the coil on a suitable measuring device.

When the natural resonance frequency is situated at the correct distance from the operating frequency and when the coil 2 has been tuned to the natural resonance frequency in the described manner, the symmetrical field distribution of the coil 2 will not be affected when the resonator 1 is placed in the position shown in the FIGS. 1 or 2 and the coil 2 is fed with the operating frequency (21.3 MHz). However, the field distribution of the coil 1 may still be non-symmetrical. A symmetrical field distribution can again be achieved, however, by varying the tuning capacitor C1 until a virtual ground point occurs in the center of the associated straight conductors L11 and L12. This can again be checked by means of a reflection factor measuring device which is connected to the coil 2 and which determines the reflection factor at the operating frequency.

Subsequently it is checked whether the rf field is symmetrical with respect to the axis 5. In the case of a symmetrical field distribution, where the uniformity of the rf magnetic field is highest, the rf magnetic field has the value zero or a minimum value in the center of the coil pair when an rf current having the resonance frequency of the second mode of oscillation (22.3 MHz) is applied to the coil 2. The field strength in the center can be determined by means of a so-called pick-up coil. When it is found that the minimum or the zero position and hence full symmetry have not yet been reached, the capacitors C1 used for tuning the coil are varied in an opposite sense until the desired minimum is obtained.

In a quadrature coil which has been tested in practice, each of the conductors L11 . . . L42 consist of a copper tube having a thickness of 8 mm and a length of 360 mm, which copper tube is flattened at its ends in the direction of the cylinder radius in order to ensure that the distance between the arc-shaped conductor sections of the tube coil pairs can remain small. The straight conductor sections are arranged on the circumference of a cylinder having a diameter of 340 mm. The arc-shaped conductor sections are formed by a copper track having a thickness of 1 mm and a width of 15 mm. High-quality factors are thus obtained (approximately 650 in the no load condicition; approximately 220 when loaded by a patient) and only slight shifts of the resonance frequency of approximately 10 KHz occur in response to the loading by a patient. Therefore, retuning of the resonance circuit after introduction of the patient is not absolutely necessary.

In the case of careful tuning, the coupling between the two coil pairs is slight. It amounts to less than 0.005. The homogeneity of the magnetic field generated by means of such a quadrature coil system is very high; measurement by means of a pick-up coil on the symmetry axis 5 reveals that the magnetic field strength varies by no more than +0.5 dB. No standing waves occur in the supply leads.

Instead of using each time two capacitors, the individual coils can also be tuned by means of only one capacitor or by means of four capacitors which must also be symmetrically arranged. When only one capacitor is used, it must also be arranged in the center of an arc-shaped conductor section; when four capacitors are used for tuning purposes, they must be effectively arranged at the four corner points of the coil, so that they connect each time the end of one straight conductor section (for example L11) to the end of an arc-shaped section (for example, L13). The use of more capacitors (having a higher capacitance) results in a smaller shift of the resonance frequency when the patient is introduced; however, the expenditure is greater. When only one capacitor is used, the opposite effect is obtained.

The quadrature coil system should be arranged with respect to the patient so that the fields generated by the two coil pairs enclose at an angle of 45° with respect to the symmetry plane of the patient. Otherwise the coil pairs would not be loaded to the same extent so that their performance would differ.

What is claimed is:

1. An rf quadrature coil system for an MRI apparatus comprising:
   two coil pairs, one pair being offset 90° with respect to the other pair and arranged for connection to an rf receiver or to an rf transmitter, said coil pairs defining an axis of symmetry;
   each said pairs comprising two similar coils which are offset 180° with respect to one another on the circumference of a cylinder, each said similar coils comprising a first plurality of conductor sections which extend parallel to said axis and a second plurality of conductors lying in planes perpendicular to said axis;
   means for tuning the two coils of each pair to the same resonance frequency; and
   means for connecting only one coil of each said pairs to said receiver or transmitter.

2. The coil system of claim 1 wherein said means for connecting includes a pair of serially connected capacitances coupled to a given conductor section of said one coil, the junction between said serially connected capacitances being connected to a reference potential and means adapted for connecting said given connector section to said receiver or transmitter.

3. The coil system of claim 2 wherein said means adapted for connecting said given conductor section includes a third capacitance connected to one of said serially connected capacitances and adapted for connection to said receiver or transmitter such that the in circuit combined capacitive value of said third and one capacitances is about the same as the value of the other of said serially connected capacitances.

4. The coil system of claim 3 wherein each coil of a pair has corresponding conductor sections in opposing 180° relative orientation to the sections of the other coil of that pair about said axis, said means for tuning includes a fourth capacitance connected to the conductor section of said other coil of each pair corresponding to and opposing the given conductor in the one coil, all said capacitances for tuning said coils of each said pair.

5. The coil system of claim 1 wherein said second plurality of conductors are concentric about said axis.

6. The coil system of claim 1 wherein the first plurality of conductors are equidistant from said axis.

7. The coil system of claim 6 wherein the second plurality of conductors are arc shaped, said first plurality of conductors defining said cylinder, the arc-shaped conductors of one pair being inside said cylinder and the arc-shaped conductors of the other pair being outside said cylinder.

8. An rf quadrature coil system as claimed in claim 6, characterized in that the conductor sections which extend parallel to the cylinder axis (5) are supported by at least two ring-shaped discs.

* * * * *